(12) United States Patent
Watanabe

(10) Patent No.: US 7,537,668 B2
(45) Date of Patent: May 26, 2009

(54) METHOD OF FABRICATING HIGH DENSITY PRINTED CIRCUIT BOARD

(75) Inventor: Ryoichi Watanabe, Daejeon (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 432 days.

(21) Appl. No.: 11/146,779

(22) Filed: Jun. 6, 2005

(65) Prior Publication Data

US 2006/0016553 A1 Jan. 26, 2006

(30) Foreign Application Priority Data

Jul. 21, 2004 (KR) ........................ 10-2004-0056867
Feb. 28, 2005 (KR) ........................ 10-2005-0016840

(51) Int. Cl.
*B32B 37/12* (2006.01)
*B32B 38/10* (2006.01)
*C23C 20/00* (2006.01)
*H05K 1/16* (2006.01)
*B32B 37/16* (2006.01)
*C23C 24/02* (2006.01)

(52) U.S. Cl. ................. 156/257; 156/233; 156/239; 156/241; 156/268; 438/118; 427/96.1; 427/96.2; 427/97.1; 427/123; 29/825; 29/830; 29/831; 174/260; 216/13; 216/20

(58) Field of Classification Search ............... 156/233, 156/239, 241, 247, 257, 268; 438/118; 427/58; 29/825, 830, 831, 846, 847, 848, 849; 174/260–264; 216/13–20

See application file for complete search history.

(56) References Cited

U.S. PATENT DOCUMENTS 4,670,089 A * 6/1987 Hanson ...................... 216/35
5,830,533 A * 11/1998 Lin et al. ..................... 427/272

(Continued)

FOREIGN PATENT DOCUMENTS

JP 2002-335079 A 11/2002

(Continued)

OTHER PUBLICATIONS

Patent Abstracts of Japan for 2004-63575 published on Feb. 26, 2004.

(Continued)

*Primary Examiner*—Philip C Tucker
*Assistant Examiner*—Sonya Mazumdar
(74) *Attorney, Agent, or Firm*—Darby & Darby P.C.

(57) ABSTRACT

A method of fabricating a high density printed circuit board by applying a strippable adhesive layer on a reinforced substrate (rigid substrate or carrier film) used as a base substrate, forming a metal foil on the adhesive layer by means of plating, lamination or sputtering, and forming a high density circuit on the metal foil serving as a seed layer by means of pattern plating. Specifically, the method of the current invention includes the steps of attaching adhesive means to one surface of a reinforced substrate (rigid substrate or carrier film), forming a seed layer on the adhesive means and forming a circuit pattern on the seed layer, laminating an insulating layer on the circuit pattern and removing the reinforced substrate (rigid substrate or carrier film), and removing the seed layer.

9 Claims, 10 Drawing Sheets

U.S. PATENT DOCUMENTS

| | | | |
|---|---|---|---|
| 6,248,612 B1 * | 6/2001 | Castro et al. | 438/106 |
| 6,919,231 B1 * | 7/2005 | Ramanathan et al. | 438/122 |
| 7,189,631 B2 * | 3/2007 | Yamazaki et al. | 438/458 |
| 2004/0018659 A1 * | 1/2004 | Hosokawa et al. | 438/106 |
| 2004/0110367 A1 * | 6/2004 | Kumakura et al. | 438/613 |

FOREIGN PATENT DOCUMENTS

| | | |
|---|---|---|
| JP | 2003-51676 A | 2/2003 |
| JP | 2003-168867 A | 6/2003 |
| JP | 2003-218524 A | 7/2003 |
| JP | 2003-218532 A | 7/2003 |
| JP | 2003-234577 A | 8/2003 |
| JP | 2003-243840 | 8/2003 |
| JP | 2003-289182 A | 10/2003 |
| JP | 2004-6687 A | 1/2004 |
| JP | 2004-47898 A | 2/2004 |
| JP | 2004-63575 A | 2/2004 |
| JP | 2004-71821 A | 3/2004 |
| JP | 2004335751 A * | 11/2004 |
| JP | 2006032947 A * | 2/2006 |

OTHER PUBLICATIONS

Patent Abstracts of Japan for 2002-335079 published on Nov. 22, 2002.
Patent Abstracts of Japan for 2003-51676 published on Feb. 21, 2003.
Patent Abstracts of Japan for 2003-168867 published on Jun. 13, 2003.
Patent Abstracts of Japan for 2003-218524 published on Jul. 31, 2003.
Patent Abstracts of Japan for 2003-218532 published on Jul. 31, 2003.
Patent Abstracts of Japan for 2003-234577 published on Aug. 22, 2003.
Patent Abstracts of Japan for 2003-289182 published on Oct. 10, 2003.
Patent Abstracts of Japan for 2004-6687 published on Jan. 8, 2004.
Patent Abstracts of Japan for 2004-71821 published on Mar. 4, 2004.
Patent Abstracts of Japan for 2004-47898 published on Feb. 12, 2004.

* cited by examiner

METHOD OF FABRICATING HIGH DENSITY PRINTED CIRCUIT BOARD

INCORPORATION BY REFERENCE

The present application claims priority under 35 U.S.C. §119 to Korean Patent Application Nos. 10-2005-016840 filed on Feb. 28, 2005 and 10-2004-0056867 filed on Jul. 21, 2004. The content of the applications is incorporated herein by reference in its entirety.

BACKGROUND OF THE INVENTION

1. Field of the Invention

The present invention relates, generally, to a method of fabricating a high density printed circuit board (PCB), and more particularly, to a method of fabricating a high density PCB, which includes applying a strippable adhesive layer on a reinforced substrate (rigid substrate or carrier film) used as a base substrate, forming a metal foil on the adhesive layer by means of plating, laminating or sputtering, and forming a high density circuit on the formed metal foil serving as a seed layer using pattern plating.

2. Description of the Related Art

Were it not for software, a computer would be nothing but a hard metal box, as in the term 'hardware'. Similarly, many ICs (Integrated Circuits) having superb performance and various electronic components would be useless, too, if they were aimlessly gathered.

Hence, in order to obtain electronic products operating in accordance with intended designs, the circuits and the components should be appropriately disposed, electrically connected to each other, and supplied with power. To this end, a PCB is used as a base substrate on which electronic components are mounted and electrically connected.

The term 'PCB' includes the word 'printed' because lines are formed using a screen printing process upon initial fabrication of the PCB.

Nowadays, although printing ink is sometimes used in a process of fabricating a single-sided PCB, a photosensitive film is applied to double-sided or other PCBs, for wiring. Thus, the term 'PCB' appears to be unsuitable. It is preferable that such a substrate be referred to as an electronic circuit board. The term 'PCB' is frequently used in Eastern Asia including Korea, whereas the term 'printed wiring board (PWB)' is frequently used in Europe and North America.

The PCB functions not only to electrically connect the electronic components but also to mechanically hold them. To increase the mechanical strength, the material constituting the PCB includes about 50% glass fiber as a reinforcing material.

Upon fabricating the PCB, since the material thereof is exposed to a high temperature of 200° C. or more, it should have heat resistance so as not to be bent or deformed.

Recently, while electronic devices are required to have high functionality and be light, slim, short and small, electronic components have been integrated and also mounted in high densities. Thus, a semiconductor package used for electronic devices has been increasingly miniaturized and the number of pins has increased.

Conventionally, a PCB called the PWB is mainly manufactured by patterning a copper foil layer of a copper-clad laminate (CCL) including a glass fiber epoxy laminate that is formed by incorporating an epoxy resin in a nonwoven fabric such as glass fiber and a copper foil layer clad on the glass fiber epoxy laminate, laminating a plurality of CCLs, forming a via hole through the laminated CCLs using a drill, and plating the wall surface of the via hole with copper so as to electrically connect the layers.

However, while the mounted components are required to be miniaturized and highly dense, the above PWB has a low wire density, hence causing problems in mounting the components.

In such circumstances, a build-up multilayer PWB has been recently used. The build-up multilayer PWB is formed by alternately stacking insulating layers formed only of a resin and conductors.

Further, the via hole is formed by use of laser, plasma, or photo methods, instead of conventional drilling, to have a small diameter. Such a via hole may be freely disposed, achieving a high density PCB.

As such, the interlayer connection is realized by means of a blind via hole or a buried via hole (a hole filled with a conductor). Among them, the buried via hole is receiving attention because it may form a stacked via hole because it enables a via hole to be formed on another via hole, thereby forming a stacked via hole.

In the buried via hole, any filling process using plating or conductive paste may be applied.

Meanwhile, the formation of the wire pattern includes, for example, a subtractive process for etching a copper foil, a semi-additive process using copper electroplating, a full-additive process using electroless copper plating, etc. Of these processes, the semi-additive process usable for a high wire density is worth noticing.

The process of etching the copper foil (subtractive process) includes attaching a photosensitive resist on a copper foil or a copper plated layer, photolithographically exposing and developing the photosensitive resist to form a resist pattern, removing unnecessary copper by etching, and removing the resist from the circuit.

FIGS. 1A to 1E are sectional views sequentially showing the fabrication of a high density PCB using a conventional subtractive process.

In FIG. 1A, a rigid substrate 101 serving as a base substrate is prepared. In FIG. 1B, an electroless copper plating process is carried out on the rigid substrate 101 used as a base substrate, to form an electroless copper plated layer 102. Subsequently, a copper electroplating process is performed on the electroless copper plated layer 102, to form a copper electroplated layer 103.

In FIG. 1C, an imaging process using a photosensitive material is performed on the copper electroplated layer 103, and thus, an etching resist 104 is patterned on the substrate.

In FIG. 1D, an etchant is sprayed to remove the copper foil, with the exception of the portion of the copper foil to be protected by the etching resist. In FIG. 1E, the etching resist, which is subsequently useless, is removed, to finally form a wire pattern of a copper foil.

In the subtractive process, the ability of forming fine circuits relies on the thickness of copper and resolution of the resist. Since the subtractive process uses a copper etching mechanism, an aspect ratio of about 2.0 to the copper thickness may be obtained. Hence, when the copper thickness is 10 µm, L/S (line and space width) is limited to 20/20 µm.

FIGS. 2A to 2E are sectional views sequentially showing the fabrication of a high density PCB using a conventional semi-additive process.

In FIG. 2A, to fabricate the high density PCB using a semi-additive process, a rigid substrate 201 serving as a base substrate is first prepared.

In FIG. 2B, an electroless copper plating process is performed on the base substrate, to form a thin seed layer 202.

In FIG. 2C, a dry film 203 is laminated on the thin seed layer 202 formed by electroless copper plating, and exposed and developed, to form a wire pattern.

In FIG. 2D, on the wire pattern formed on the thin seed layer 202 that is electroless copper plated, a copper electroplated layer 204 is formed using a copper electroplating process, thus completing the wire pattern of the copper foil.

In FIGS. 2E and 2F, the dry film 203 and the seed layer 202 are sequentially removed, to complete a desired circuit pattern.

As for the semi-additive process, since the residue of the seed layer or the circuit width may be over-etched upon etching the electroless copper seed layer, L/S is limited to 15/15 μm.

FIGS. 3A to 3D are sectional views sequentially showing the fabrication of a high density PCB using a conventional full-additive process.

In FIG. 3A, to fabricate the high density PCB using a full-additive process, an insulating resin substrate 301 serving as a base substrate is first prepared.

In FIG. 3B, a photosensitive resist 302 is attached to the surface of the insulating resin substrate 301, and exposed and developed, to form a resist pattern.

In FIG. 3C, an electroless copper plating process is performed on the wire pattern formed by the photosensitive resist 302, to form an electroless copper plated layer 303.

Then, in FIG. 3D, the photosensitive resist 302 is removed to complete a circuit.

As for the full-additive process, the ability of forming fine circuits relies on the resolution of the resist and the thickness of the copper deposited by electroless plating, and L/S is limited to 15/15 μm.

In the case where the circuit is formed using the subtractive process, side etching by the etchant may occur and negatively affects the formation of finer circuits. Thus, respective PCB manufacturers have used a semi-additive process.

In the semi-additive process, however, limitations are imposed on the manifestation of sufficient performance of the resist and the formation of fine circuits, attributable to the adhesion of the resist and the adhesion of the copper circuit exclusively depending on the material of the insulating layer and the state of the adhering surface upon forming the fine lines.

Further, seed etching for use in etching the copper seed layer formed by electroless plating or sputtering negatively affects the fineness of circuits. That is, the seed etching may etch the circuit, as well as the seed layer. Thus, upon pattern plating, the thickness of the plated layer and the line width are corrected to be large.

Due to the correction, it is difficult to realize the fine circuits. In seed etching, the etchant may infiltrate the copper circuit, and the circuit may become loose. In addition, insufficient seed etching causes the seed layer to remain, leading to short-circuit problems. Such problems become significant as the intervals between circuits decrease.

Japanese Patent Laid-open Publication No. 2004-63575, aiming at increasing the area of a copper pad to be mounted, using a single-sided CCL, forming a circuit by a subtractive process, and etching a resin, is quite different from the present invention. Further, the above patent is unsuitable for use in the fabrication of high density PCBs, since the circuits are formed using the subtractive process.

Japanese Patent Laid-open Publication Nos. 2002-335079, 2003-51676, 2003-168867, 2003-218524, 2003-218532, 2003-234577, 2003-289182, and 2004-6687 disclose a method of forming a circuit. These patents, concerning the removal of a metal sheet or a metal foil, which is used as a current application portion, by etching, are different from the present invention in which a strippable layer is stripped.

Japanese Patent Laid-open Publication No. 2004-071821 discloses a method of forming a circuit, including forming a copper foil on an adhesive layer, forming the copper foil into a circuit using a subtractive process, and transferring the circuit to an insulating substrate. However, this patent is disadvantageous because fine circuits cannot be formed using the subtractive process.

On the other hand, a wire transferring method using a semi-additive process makes free circuit design possible, and thus, is used to form multilayer PCBs by a collective lamination process. The wire transferring method using the semi-additive process includes forming an insulating resin layer on the wire-forming surface of a conductive frame. As such, to ensure the adhesion between the wire surface and the insulating resin layer, heat treatment is performed.

Since the heat treatment requires a high temperature of 200° C. or more, such heat hysteresis induces mutual diffusion between copper used for the conductive frame and gold used as a barrier metal, thereby forming an alloy layer. Accordingly, after the conductive frame is removed, the copper-gold alloy is exposed, resulting in a flip chip that is poorly bonded to the gold stud bump or weak adhesion of a soldering adhesive upon soldering, reduced reliability of the bonded portion, reduced mounting reliability, and high product defect rates.

To solve the problems, Japanese Patent Laid-open Publication No. 2004-47898 discloses a method of fabricating a PWB and a method of fabricating a multilayer PWB, in which the above methods includes forming a metal diffusion prevention layer to manufacture a high density substrate.

However, the methods of fabricating a PWB and a multilayer PWB disclosed in Japanese Patent Laid-open Publication No. 2004-47898 are disadvantageous because too long a time is required to remove the conductive frame by etching.

That is, in the methods of fabricating a PWB and a multilayer PWB disclosed in Japanese Patent Laid-open Publication No. 2004-47898, a first etching and a second etching for selective etching using sulfric acid ($H_2SO_4$) are performed to remove a nickel (Ni) board used as a conductive frame. As such, the first etching and the second etching require 1320 sec and 3600 sec, respectively, and the total etching time amounts to 4920 sec, which is about 1.5 hr. Hence, the above patent is difficult to put to practical use.

Specifically, in the methods of fabricating a PWB and a multilayer PWB disclosed in Japanese Patent Laid-open Publication No. 2004-47898, the nickel board used as a conductive frame is about 200 μm thick.

The first etching is performed under conditions of a temperature of 30-37.6° C., a spray pressure of 0.1 MPa, a chamber length of 1.3 m, and a conveyor speed of 0.65 m/min, using a solution including 20% $H_2NO_3$ and 1.75% $H_2O_2$.

The first etching under the above conditions is carried out 11 times at an etching rate of 7-8 μm/min, thus requiring 1320 sec.

Then, the second etching, which is used to selectively etch only the nickel board, is performed under conditions of a temperature of 25.0-27.5° C., a spray pressure of 0.1 MPa, a chamber length of 1.3 m, and a conveyor speed of 0.65 m/min, using a solution including 10% $H_2SO_4$ and 1.75% $H_2O_2$.

The second etching under the above conditions is conducted 30 times at an etching rate of 1.0-2.0 μm/min, thus requiring 3600 sec.

In this way, the etching process including the first etching and the second etching requires 4920 sec, which is about 1.5 hr. Thus, it is difficult to actually manufacture products using the above technique.

SUMMARY OF THE INVENTION

Accordingly, the present invention has been made keeping in mind the above problems occurring in the related art, and an object of the present invention is to provide a method of fabricating a high density PCB by applying a strippable adhesive layer on a reinforced substrate (rigid substrate or carrier film) used as a base substrate, forming a metal foil on the adhesive layer by means of plating, laminating or sputtering, and forming a high density circuit by pattern plating on the metal foil serving as a seed layer.

In order to accomplish the above object, the present invention provides a method of fabricating a high density PCB, which includes the steps of attaching adhesive means to one surface of a reinforced substrate; forming a seed layer on the adhesive means and forming a circuit pattern on the seed layer; laminating an insulating layer on the circuit pattern and removing the reinforced substrate; and removing the seed layer.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, a detailed description will be given of a method of fabricating a high density PCB according to the embodiments of the present invention, with reference to the appended drawings.

FIGS. 4A to 4G are sectional views sequentially showing the fabrication of a high density PCB using a base substrate having an adhesive layer formed thereon, according to an embodiment of the present invention.

Figure 1A:
FIGS. 1A to 1E are sectional views sequentially showing the fabrication of a high density PCB using a conventional subtractive process.
Figure 1B:
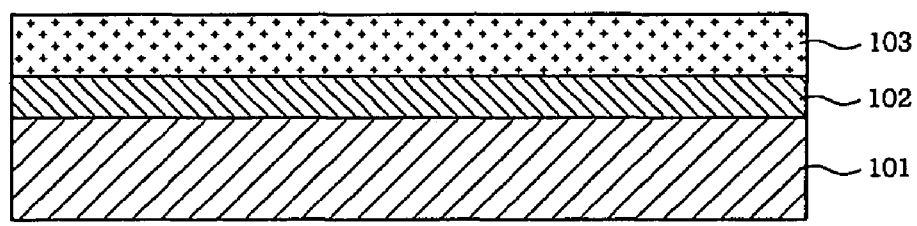
Figure 1C:
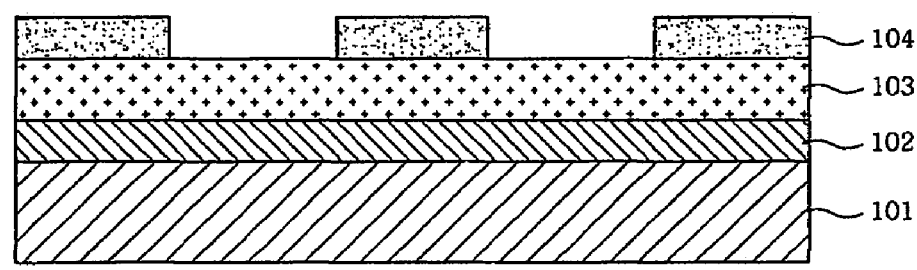
Figure 1D:
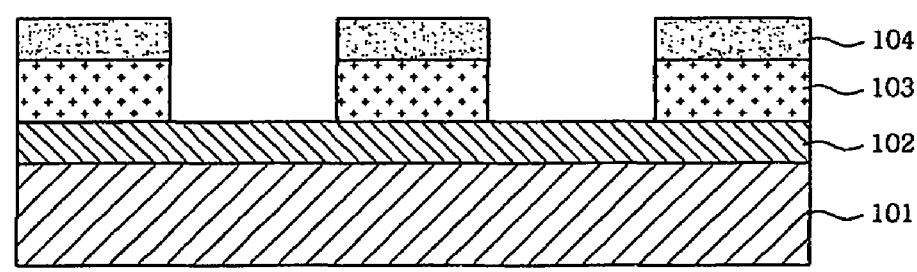
Figure 1E:
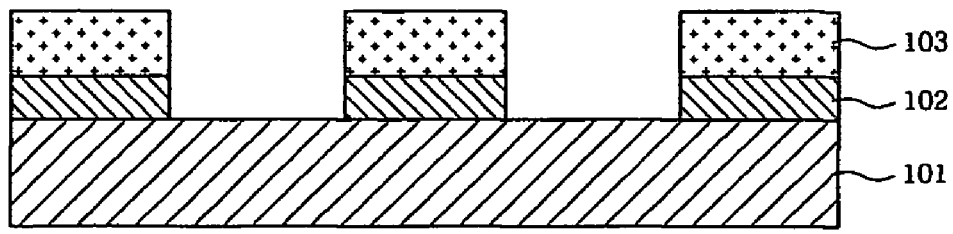
Figure 2A:
FIGS. 2A to 2F are sectional views sequentially showing the fabrication of a high density PCB using a conventional semi-additive process.
Figure 2B:
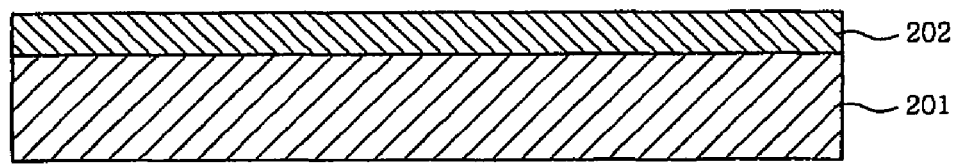
Figure 2C:
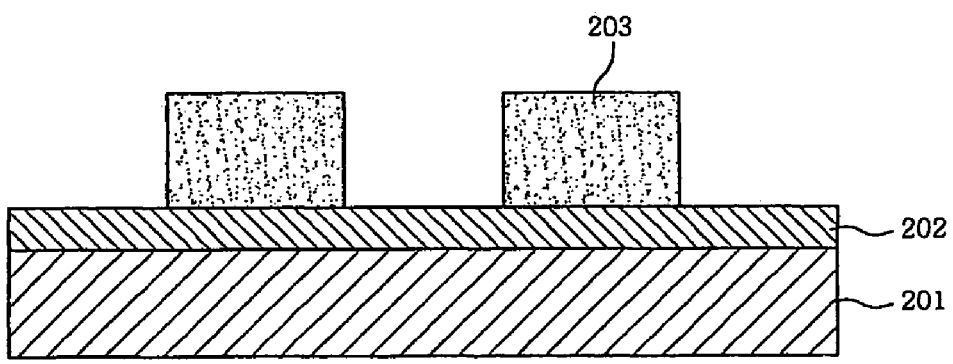
Figure 2D:
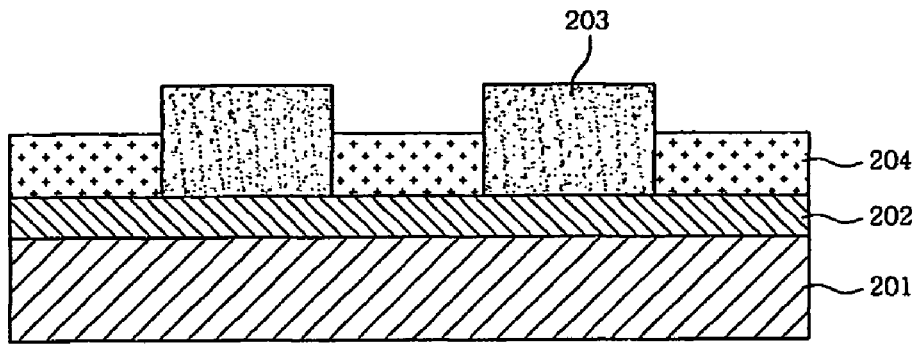
Figure 2E:
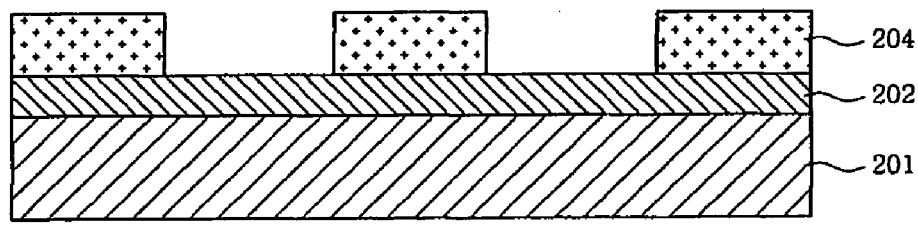
Figure 2F:
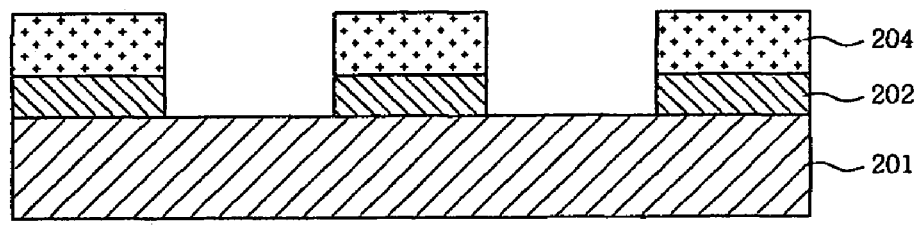
Figure 3A:
FIGS. 3A to 3D are sectional views sequentially showing the fabrication of a high density PCB using a conventional full-additive process.
Figure 3B:
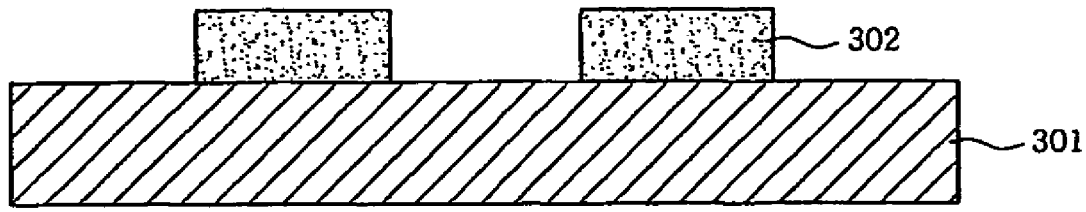
Figure 3C:
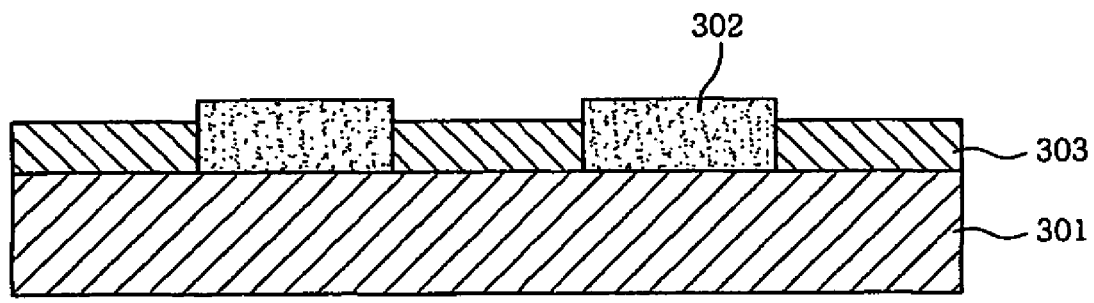
Figure 3D:
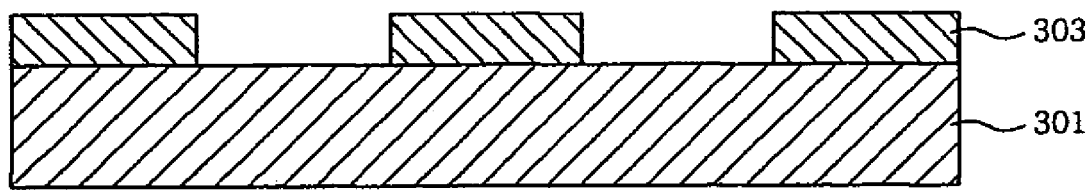
Figure 4A:
FIGS. 4A to 4G are sectional views sequentially showing the fabrication of a high density PCB using a base substrate having an adhesive layer attached thereto, according to an embodiment of the present invention.

In FIG. 4A, to fabricate the high density PCB using a base substrate having an adhesive layer formed thereon according to an embodiment of the present invention, a reinforced substrate 401, serving as the base substrate, is first prepared. As such, the reinforced substrate 401 includes, for example, a rigid substrate or a carrier film.

On the reinforced substrate (rigid substrate or carrier film) 401 used as the base substrate, an adhesive layer 402, which is strippable by heat or ultraviolet rays, is applied, to obtain a desired base substrate. At this time, although the reinforced substrate (rigid substrate or carrier film) 401 may be formed of any material, glass is preferably used when using the adhesive layer 402 strippable by ultraviolet rays.

Figure 4B:

In FIG. 4B, the adhesive layer 402 is applied on the reinforced substrate (rigid substrate or carrier film) 401 used as the base substrate. As such, the adhesive layer 402 is formed of a material having drastically decreased adhesion when exposed to ultraviolet rays (such an adhesive layer is referred to as "an adhesive layer strippable by ultraviolet rays"), or a material having drastically decreased adhesion when heat is applied (such an adhesive layer is referred to as "an adhesive layer strippable by heat"). The adhesion of the adhesive layer 402 strippable by ultraviolet rays decreases over time upon continuous exposure to ultraviolet rays. Also, the adhesion of the adhesive layer 402 strippable by heat decreases depending on the temperature at the time of application of heat at a predetermined temperature.

Figure 4C:
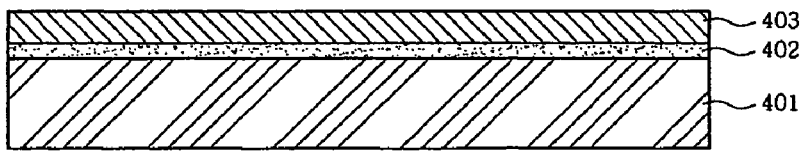

In FIG. 4C, a metal, which is different from a metal used to form a circuit, is electroless plated, laminated, or sputtered on the adhesive layer 402, to obtain a metal foil usable as a seed layer 403 for circuit formation.

Figure 4D:
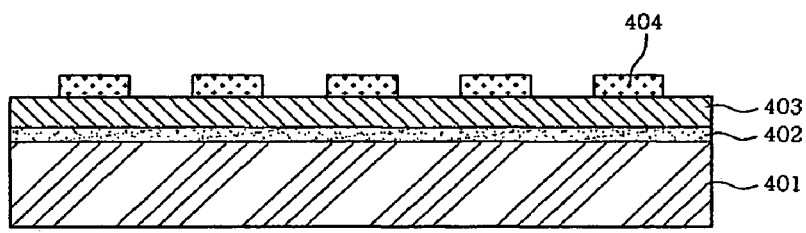

In FIG. 4D, a circuit layer 404 is formed on the seed layer 403 using pattern plating. The formation of the circuit layer 404 is achieved by laminating a plating resist layer (not shown), for example, a dry film resist photosensitive to ultraviolet rays, on the seed layer 403, or by applying a liquid resist on the seed layer 403, drying the applied resist, exposing the dried resist using an exposure mask, and developing it, to obtain a desired pattern.

Figure 4E:
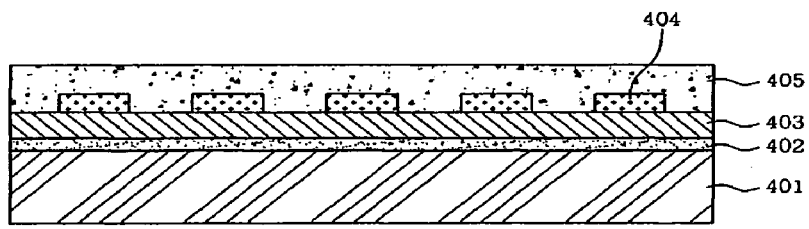
Figure 4F:
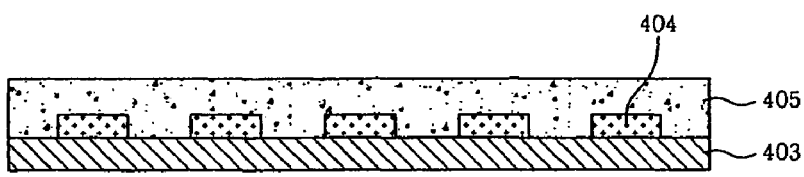
Figure 4G:

In FIG. 4E, a lamination process for embedding the circuit layer 404 thus formed in an insulating resin layer 405 is performed. In FIG. 4F, the adhesive layer 402 is stripped, and, in FIG. 4G, the seed layer 403 is removed by flash etching to expose the surface of the circuit.

As such, the adhesive layer 402 is stripped as follows. That is, in the case of using an adhesive layer 402 strippable by ultraviolet rays, the adhesion of the adhesive layer 402 decreases when exposed to ultraviolet rays which are radiated through the reinforced substrate 401, thus removing the reinforced substrate 401. In this case, the reinforced substrate 401 is formed of glass. Therefore, when ultraviolet rays are radiated upwards from a lower portion of the reinforced substrate 401, the adhesive layer 402 is exposed to ultraviolet rays radiated through the reinforced substrate 401, and hence, its adhesion decreases, resulting in a removed reinforced substrate 401. That is, when ultraviolet rays are radiated upwards from the lower portion of the reinforced substrate (rigid substrate or carrier film) 401 formed of glass, the adhesion of the adhesive layer 402 is weakened over time. After a predetermined time, the base substrate is removed. As such, the adhesion of the adhesive layer 402 may be different on upper and lower surfaces thereof. If the upper surface of the adhesive layer 402 has weaker adhesion than the lower surface thereof, even if ultraviolet rays are radiated for the same amount of time, the adhesion of the upper surface of the adhesive layer 402 first reaches a critical value allowing the reinforced substrate 401 to be removed from the seed layer 403, thus removing the reinforced substrate 401 from the seed layer 403. As such, the reinforced substrate 401 thus removed has the adhesive layer 402 attached thereto. In contrast, if the adhesion of the lower surface of the adhesive layer 402 reaches a critical value more rapidly than that of the upper surface thereof, only the reinforced substrate 401 is removed from the seed layer 403, and the adhesive layer 402 should be additionally removed from the seed layer 403 in a subsequent procedure.

Meanwhile, in the case of using an adhesive layer 402 strippable by heat, when heat is gradually applied to the adhesive layer 402 until a predetermined temperature is attained, the adhesion of the adhesive layer 402 reaches a critical value allowing the reinforced substrate 401 to be removed from the seed layer 403. Thereby, the reinforced substrate 401 is removed from the seed layer 403.

In such a case, the adhesion of the adhesive layer 402 may be different on upper and lower surfaces thereof. If the upper surface of the adhesive layer 402 has weaker adhesion than the lower surface thereof, the adhesion of the upper surface of the adhesive layer 402 first reaches a critical value allowing the reinforced substrate 401 to be removed from the seed layer 403 at a predetermined temperature, thus removing the reinforced substrate 401 from the seed layer 403. As such, the reinforced substrate 401 thus removed has the adhesive layer 402 attached thereto. In contrast, when the adhesion of the lower surface of the adhesive layer 402 reaches a critical value more rapidly than that of the upper surface thereof, only the reinforced substrate 401 is removed from the seed layer 403, and the adhesive layer 402 should be additionally removed from the seed layer 403 in a subsequent procedure.

Then, the seed layer 403 is etched using a selective etchant (e.g., dilute sulfuric acid when the metal seed layer is formed of nickel), capable of etching only the metal seed layer 403 without etching the circuit layer 404 when the metal of the circuit layer 404 is different from that of the seed layer 403.

For example, in the case where the metal seed layer 403 is a 12 μm thick nickel layer, the etching process is carried out 5 times at an etching rate of 1.0 μm/min under conditions of an etching temperature maintained at about 25° C., a spray pressure of 0.1 MPa, and a chamber length of 1.3 m, using an etchant including $H_2SO_4$ and $H_2O_2$. Thereby, the nickel layer is removed within 390 sec.

In this way, although a conventional etching technique requires 3600 sec, the etching process of the present invention is performed for 390 sec. From this, it can be seen that the etching process of the present invention is conducted for a short time.

For the base substrate used in the method of fabricating the high density PCB according to the embodiment of the present invention, any material may be used as long as it may function as the above base substrate.

As in FIGS. 4A to 4G, on the adhesive layer attached to any one surface of the base substrate, a metal different from the metal used for circuit formation is electroless plated, laminated or sputtered to obtain the thin metal seed layer for circuit formation. However, in FIGS. 5A to 5G, a metal the same as a metal used for circuit formation is electroless plated, laminated or sputtered on an adhesive layer 502 formed on any one surface of a base substrate 501, to form a metal foil as a seed layer 503 for circuit formation.

When the same material as the metal used for circuit formation is used, the process is conducted according to the following procedures.

Figure 5A:
FIGS. 5A to 5G are sectional views sequentially showing the fabrication of a high density PCB using a base substrate having an adhesive layer attached thereto, according to another embodiment of the present invention.

In FIG. 5A, to fabricate a high density PCB using a base substrate having an adhesive layer attached thereto according to another embodiment of the present invention, a reinforced substrate 501 used as a base substrate is first prepared. As such, the reinforced substrate 501 includes, for example, a rigid substrate or a carrier film.

Then, an adhesive layer 502 strippable by heat or ultraviolet rays is applied on the reinforced substrate 501 used as a base substrate, to complete the base substrate. As such, the reinforced substrate 501 may be formed of any material. If an adhesive layer 502 strippable by ultraviolet rays is used, it is preferable that the reinforced substrate 501 be formed of glass.

Figure 5B:
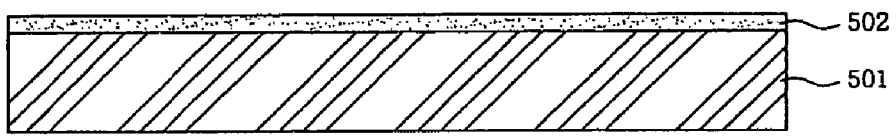

In FIG. 5B, an adhesive layer 502 is applied on the reinforced substrate 501 used as a base substrate. The adhesive layer 502 may be an adhesive layer strippable by ultraviolet rays or an adhesive layer strippable by heat.

Figure 5C:
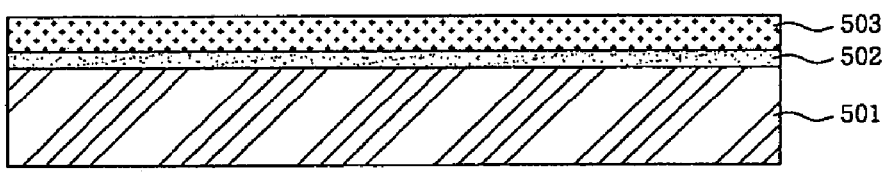

Thereafter, in FIG. 5C, the same metal as the metal used for circuit formation is electroless plated, laminated, or sputtered on the adhesive layer 502, to form a metal foil as a seed layer 503 for circuit formation.

Figure 5D:
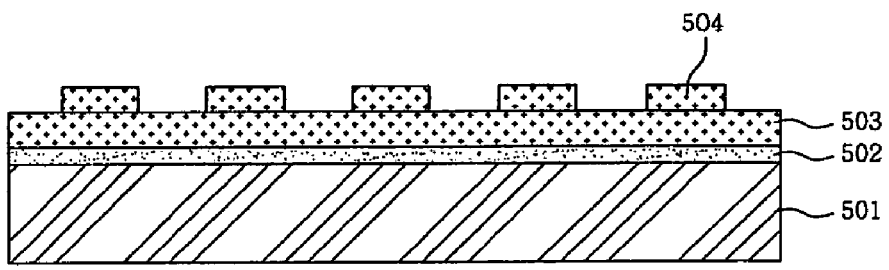

In FIG. 5D, a circuit layer 504 is formed on the seed layer 503 using pattern plating. Such a circuit layer 504 is formed by laminating a plating resist layer (not shown), for example, a dry film resist photosensitive to ultraviolet rays, on the seed layer 503, or by applying a liquid resist on the seed layer 503, drying the applied resist, exposing the resist using an exposure mask and developing it, to obtain a desired pattern.

Figure 5E:
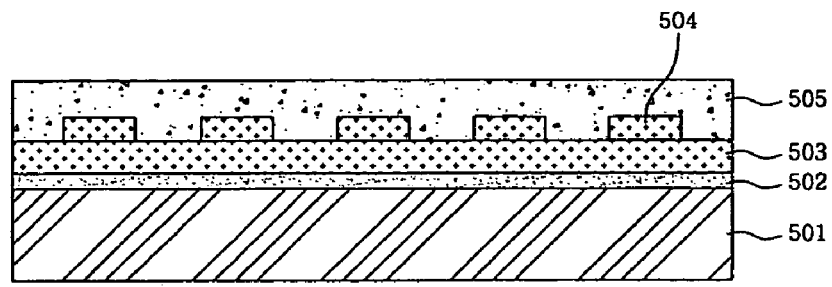
Figure 5F:
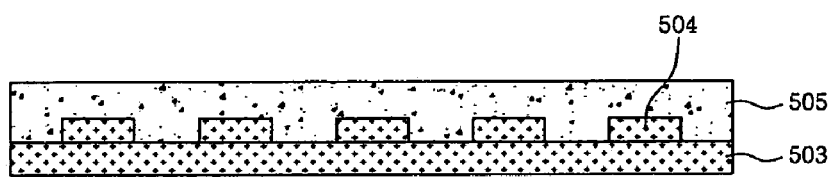
Figure 5G:

In FIG. 5E, a lamination process for embedding the circuit layer 504 thus formed in an insulating resin layer 505 is performed. In FIG. 5F, the adhesive layer 502 is stripped, and, in FIG. 5G, the seed layer 503 is flash etched, and thus, the surface of the circuit is exposed.

Although the adhesive layer mentioned above uses a single layer, it may use an adhesive tape. In this regard, the use of the adhesive tape is shown in FIGS. 6A to 6G and FIGS. 7A to 7G.

FIGS. 6A to 6G are sectional views sequentially showing the fabrication of a high density PCB according to yet another embodiment of the present invention, in which an adhesive tape is used.

Figure 6A:
FIGS. 6A to 6G are sectional views sequentially showing the fabrication of a high density PCB using a base substrate having an adhesive tape attached thereto, according to yet another embodiment of the present invention.

In FIG. 6A, to fabricate a high density PCB according to the present embodiment of the invention, an adhesive tape having adhesive layers 602a and 602b strippable by ultraviolet rays formed on both surfaces of a tape base 601 is prepared.

Figure 6B:
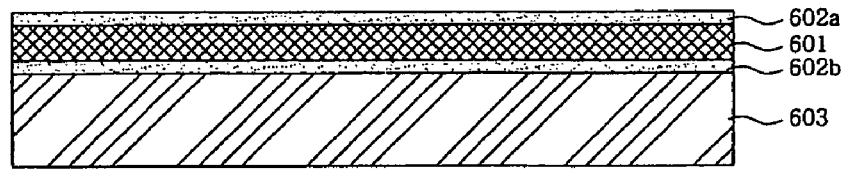

In FIG. 6B, the adhesive tape having adhesive layers 602a and 602b strippable by ultraviolet rays formed on both surfaces of a tape base 601 is attached to the upper surface of a glass base substrate 603.

Figure 6C:
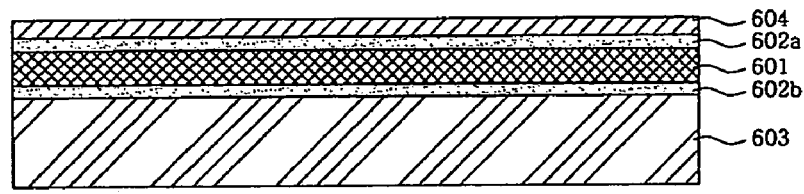

In FIG. 6C, in the case where the metal used for circuit formation is copper, a metal (e.g., nickel) other than copper is electroless plated, laminated or sputtered on the adhesive layer 602a, to form a metal foil as a metal seed layer 604.

Figure 6D:
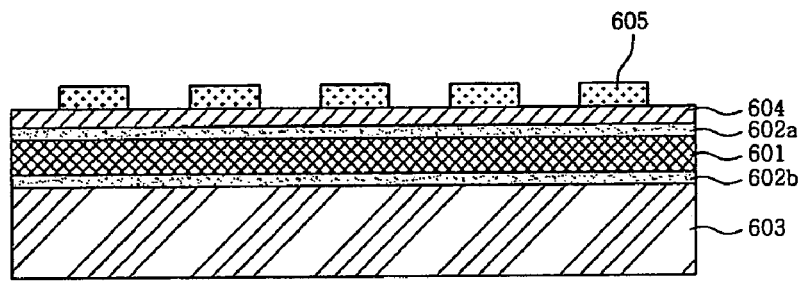

In FIG. 6D, a circuit layer 605 is formed on the seed layer 604 using pattern plating. Such a circuit layer 605 is formed by laminating a plating resist layer (not shown), for example, a dry film resist photosensitive to ultraviolet rays, on the seed layer 604, or by applying a liquid resist on the seed layer 604, drying the applied resist, exposing the resist using an exposure mask and developing it, to obtain a desired pattern.

Figure 6E:
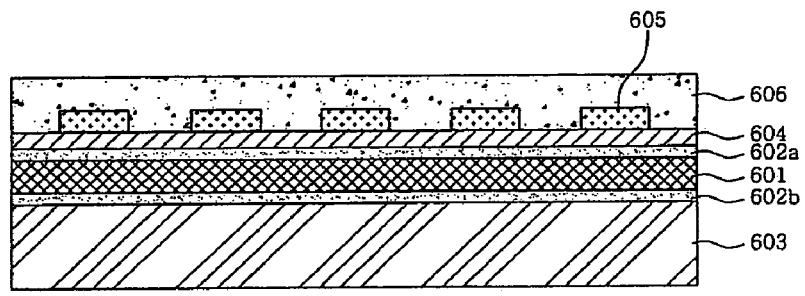
Figure 6F:
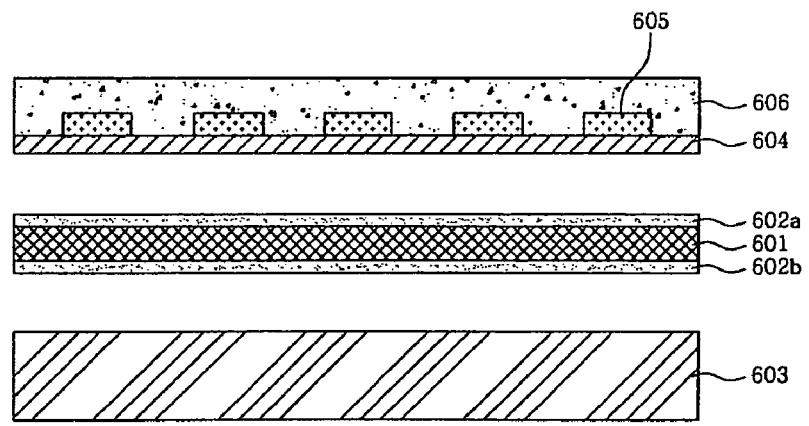

In FIG. 6E, a lamination process for embedding the circuit layer 605 thus formed in an insulating resin layer 606 is conducted. In FIG. 6F, the adhesive tape having adhesive layers 602a and 602b attached to both surfaces of a tape base 601 is removed. As such, when ultraviolet rays are radiated onto the base substrate 603, the adhesive layer 602a is stripped, thereby separating the copper seed layer 604, the adhesive tape, and the glass base substrate 603 from one another. Eventually, the base substrate 603 may be reused, and fabrication costs may be reduced.

Figure 6G:

Finally, in FIG. 6G, the seed layer 604 of the substrate is etched, thus exposing the surface of the circuit.

Although the process shown in FIGS. 6A to 6G illustrates the case of using the adhesive layer strippable by ultraviolet rays, it may be identically applied to the case of using an adhesive layer strippable by heat.

In addition, the seed layer and the circuit layer are formed of metals different from each other as shown in FIGS. 6A to 6G, whereas they may be formed of the same metal, which case is depicted in FIGS. 7A to 7G.

FIGS. 7A to 7G are sectional views sequentially showing the fabrication of a high density PCB according to a further embodiment of the present invention.

Figure 7A:
FIGS. 7A to 7G are sectional views sequentially showing the fabrication of a high density PCB using a base substrate having an adhesive tape attached thereto, according to a further embodiment of the present invention.

In FIG. 7A, to fabricate a high density PCB according to the present embodiment of the invention, an adhesive tape having adhesive layers 702a and 702b strippable by ultraviolet rays formed on both surfaces of a tape base 701 is prepared.

Figure 7B:
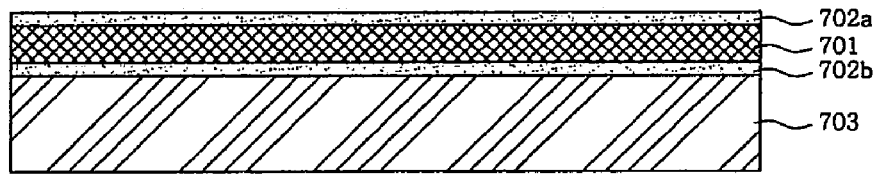

In FIG. 7B, the adhesive tape having adhesive layers 702a and 702b strippable by ultraviolet rays formed on both surfaces of a tape base 701 is attached to the upper surface of a glass base substrate 703.

Figure 7C:
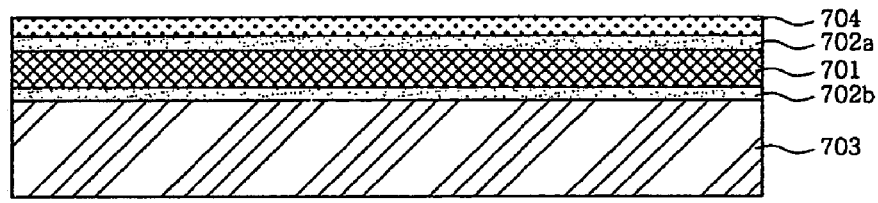

In FIG. 7C, in the case where the metal used for circuit formation is copper, copper is electroless plated, laminated or sputtered on the adhesive layer 702a, to form a metal foil as a metal seed layer 704.

Figure 7D:
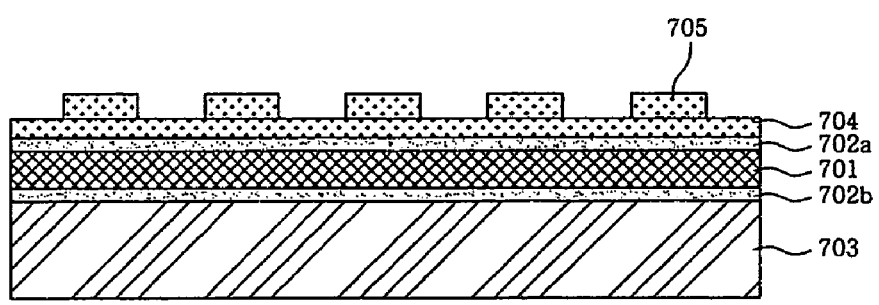

In FIG. 7D, a circuit layer 705 is formed on the seed layer 704 using pattern plating. Such a circuit layer 705 is formed by laminating a plating resist layer (not shown), for example, a dry film resist photosensitive to ultraviolet rays, on the seed layer 704, or by applying a liquid resist on the seed layer 704, drying the applied resist, exposing the resist using an exposure mask and developing it, to obtain a desired pattern.

Figure 7E:
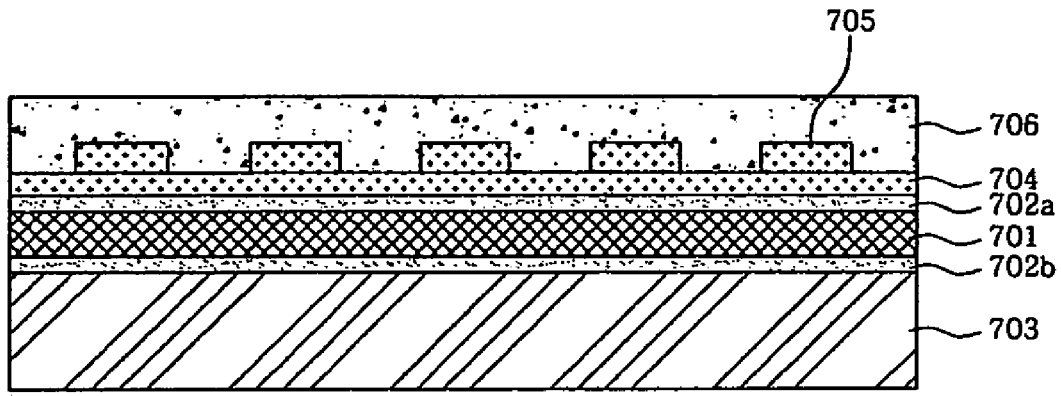
Figure 7F:
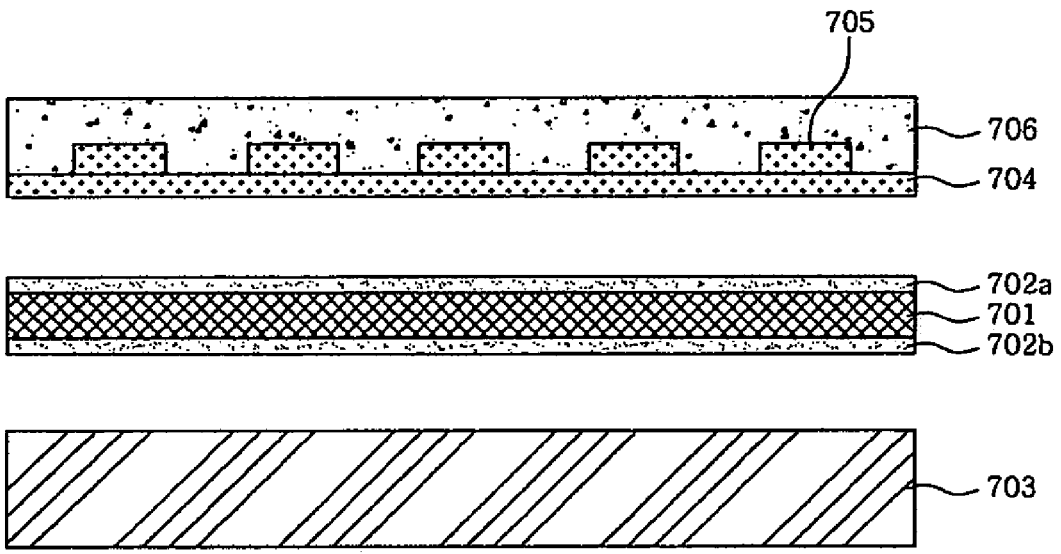

In FIG. 7E, a lamination process for embedding the circuit layer 705 thus formed in an insulating resin layer 706 is carried out. In FIG. 7F, the adhesive tape having adhesive layers 702a and 702b attached to both surfaces of a tape base 701 is removed. In this case, when ultraviolet rays are radiated onto the base substrate 703, the adhesive layer 702a is stripped, thereby separating the copper seed layer 704, the adhesive tape, and the glass base substrate 703 from one another. Eventually, the base substrate 703 may be reused, and fabrication costs may be reduced.

Figure 7G:

Finally, in FIG. 7G, the seed layer 704 of the substrate is flash etched, thus exposing the surface of the circuit.

Although the process shown in FIGS. 7A to 7G illustrates the case of using the adhesive layer strippable by ultraviolet rays, it may be identically applied to the case of using an adhesive layer strippable by heat.

Using the fabrication method of the present invention, it is possible to form fine circuits for all kinds of PCBs, including multi-sided PCBs, double-sided PCBs, multilayer PCBs, build-up PCBs, flexible PCBs, multi-flex PCBs, rigid-flexible PCBs, etc.

Although the embodiments to perform the method of fabricating the high density PCB of the present invention have been disclosed for illustrative purposes, those skilled in the art will appreciate that various modifications, additions and substitutions are possible, without departing from the scope and spirit of the invention as disclosed in the accompanying claims.

As described above, the present invention provides a method of fabricating a high density PCB. In the case where a fine circuit is formed using a photo resist, the adhesion of the resist is greatly affected by the material of the insulating layer and the state of the adhering surface. Thus, when the surface of the substrate is formed of a metal to be suitable for adhesion of the resist, the resist may adhere most strongly to the substrate.

In the present invention, since the metal seed layer is removed by etching, following embedding the circuit of the base substrate in the insulating layer, it does not require flash etching, as does a conventional semi-additive process. Thus, the method of the present invention has no problems caused by seed etching when forming fine circuits using the semi-additive process.

Further, since over-etching of the circuit due to the flash etching of the semi-additive process does not occur in the present invention, the circuits may be formed finer, and also, the line width accuracy is improved and impedance properties are stabilized.

In the present invention, the etching of the metal foil is conducted on the back side of the metal foil, unlike the seed etching of the semi-additive process, and thus, the process is easily performed and process management becomes convenient.

In the present invention, since the lamination process for embedding the circuit in the insulating layer is adopted, the circuits are uniformly formed without unevenness. Additionally, defect rates due to process damage are decreased, and productivity is expected to be high.

Moreover, since the circuit is embedded in the insulating layer, the adhesion between the circuit and the insulating layer is achieved through three surfaces, including the bottom surface and both side surfaces of the circuit. Thereby, the adhesive strength increases. Also, an insulating material unusable in a conventional process may be used in the present invention.

What is claimed is:

1. A method of fabricating a high density printed circuit board, comprising the steps of:
    attaching an adhesive to one surface of a reinforced substrate;
    forming a seed layer on the adhesive using a first metal; and
    forming a circuit pattern on the seed layer using a second metal, the first metal and the second metal being different;
    laminating an insulating layer on the circuit pattern, and removing the reinforced substrate; and
    removing the seed layer using a selective etchant capable of etching only the seed layer without etching the circuit pattern.

2. The method as set forth in claim 1, wherein the adhesive comprises adhesive material that exhibits a decrease in adhesion when exposed to ultraviolet rays.

3. The method as set forth in claim 2, wherein the laminating step comprises the steps of:
    laminating the insulating layer onto the circuit pattern on the seed layer;
    radiating ultraviolet rays upwards from a lower portion of the reinforced substrate; and
    removing the reinforced substrate.

4. The method as set forth in claim 1, wherein the adhesive comprises adhesive material that exhibits a decrease in adhesion when exposed to heat.

5. The method as set forth in claim 4, wherein the laminating step comprises the steps of:
    laminating the insulating layer onto the circuit pattern on the seed layer;
    applying heat to the adhesive; and
    removing the reinforced substrate.

6. The method as set forth in claim 1, wherein the adhesive comprises adhesive material on an upper and a lower surface of a tape base that exhibits a decrease in adhesion when exposed to ultraviolet rays.

7. The method as set forth in claim 6, wherein the laminating step further comprises the steps of:
   laminating the insulating layer onto the circuit pattern on the seed layer;
   radiating ultraviolet rays upwards from a lower portion of the reinforced substrate; and
   removing the reinforced substrate.

8. The method as set forth in claim 1, wherein the adhesive comprises adhesive material on an upper and a lower surface of a tape base that exhibits a decrease in adhesion when exposed to heat.

9. The method as set forth in claim 8, wherein the laminating step further comprises the steps of:
   laminating the insulating layer onto the circuit pattern on the seed layer;
   applying heat to the adhesive layer strippable by heat; and
   removing the reinforced substrate.

* * * * *